United States Patent
Liu et al.

(10) Patent No.: US 8,324,082 B1
(45) Date of Patent: Dec. 4, 2012

(54) METHOD FOR FABRICATING CONDUCTIVE SUBSTRATES FOR ELECTRONIC AND OPTOELECTRONIC DEVICES

(75) Inventors: Wen-Huang Liu, Hsinchu County (TW); Yung-Wei Chen, Taichung (TW)

(73) Assignee: SemiLEDS OPTOELECTRONICS Co., Ltd., Chu-Nan (TW)

( * ) Notice: Subject to any disclaimer, the term of this patent is extended or adjusted under 35 U.S.C. 154(b) by 0 days.

(21) Appl. No.: 13/233,070

(22) Filed: Sep. 15, 2011

(51) Int. Cl.
*H01L 21/301* (2006.01)
*H01L 21/46* (2006.01)
*H01L 21/78* (2006.01)

(52) U.S. Cl. ........ 438/460; 438/462; 438/458; 438/459; 257/678; 257/723; 257/E21.237; 257/E21.508

(58) Field of Classification Search .................. None
See application file for complete search history.

(56) References Cited

U.S. PATENT DOCUMENTS

| | | | |
|---|---|---|---|
| 5,024,966 A | 6/1991 | Dietrich et al. | |
| 6,268,600 B1 | 7/2001 | Nakamura et al. | |
| 6,531,328 B1 | 3/2003 | Chen | |
| 6,562,643 B2 | 5/2003 | Chen | |
| 6,818,464 B2 | 11/2004 | Heschel | |
| 6,964,915 B2 | 11/2005 | Farnworth et al. | |
| 7,081,412 B2 | 7/2006 | Heschel | |
| 7,224,051 B2 | 5/2007 | Farnworth et al. | |
| 8,202,804 B2 * | 6/2012 | Sandhu | ........................ 438/702 |

\* cited by examiner

*Primary Examiner* — Zandra Smith
*Assistant Examiner* — Khanh Duong
(74) *Attorney, Agent, or Firm* — Stephen A. Gratton

(57) ABSTRACT

A method for fabricating a conductive substrate for an electronic device includes the steps of providing a semiconductor substrate; forming a plurality of grooves part way through the semiconductor substrate; filling the grooves with a polymer insulating material to form a plurality of polymer filled grooves; thinning the substrate from the back side to expose the polymer filled grooves; and singulating the semiconductor substrate into a plurality of conductive substrates. An optoelectronic device includes a conductive substrate; a polymer filled groove configured to separate the conductive substrate into a first semiconductor substrate and a second semiconductor substrate; a first front side electrode on the first semiconductor substrate and a second front side electrode on the second semiconductor substrate; and a light emitting diode (LED) chip on the first semiconductor substrate in electrical communication with the first front side electrode and with the second front side electrode.

20 Claims, 16 Drawing Sheets ical isolate these electrical elements. Electrical isolation has typically been accomplished by depositing or growing insulating materials, such as polymers or oxides, on various surfaces of the substrate. In general, these techniques require specialized equipment, such as deposition or oxidation apparatus, and are therefore relatively expensive to perform. In addition, the deposited or grown insulating layers can adversely affect heat transfer paths from elements on the conductive substrate.

METHOD FOR FABRICATING CONDUCTIVE SUBSTRATES FOR ELECTRONIC AND OPTOELECTRONIC DEVICES

BACKGROUND

This disclosure relates generally to the fabrication of conductive substrates for electronic devices, particularly optoelectronic devices, such as light emitting diodes (LEDs).

Many electronic devices include a conductive substrate on which different electrical elements are mounted. For example, an optoelectronic device can include a conductive substrate make of a semiconductor material, such as silicon, and a light emitting diode (LED) chip mounted to the conductive substrate. In addition to providing a support structure for the LED chip, the conductive substrate can also include other electrical elements, such as terminals and conductors for making electrical connections to the LED chip. In addition, the conductive substrate can include heat transfer paths from the LED chip for dissipating heat generated during operation of the optoelectronic device.

Due to the operation of the various electrical elements on the conductive substrate, it is sometimes necessary to electrically isolate these electrical elements. Electrical isolation has typically been accomplished by depositing or growing insulating materials, such as polymers or oxides, on various surfaces of the substrate. In general, these techniques require specialized equipment, such as deposition or oxidation apparatus, and are therefore relatively expensive to perform. In addition, the deposited or grown insulating layers can adversely affect heat transfer paths from elements on the conductive substrate.

It would be advantageous to have a low cost method for fabricating conductive substrates for electronic devices. It would also be advantageous to have a method, which produces conductive substrates for optoelectronic devices with lower thermal resistance, higher brightness, improved efficiency and better reliability. The present disclosure is directed to a low cost method for fabricating conductive substrates, which produces improved electronic devices, particularly optoelectronic devices. However, the foregoing examples of the related art and limitations related therewith, are intended to be illustrative and not exclusive. Other limitations of the related art will become apparent to those of skill in the art upon a reading of the specification and a study of the drawings.

SUMMARY

A method for fabricating a conductive substrate for an electronic device includes the steps of providing a semiconductor substrate having a front side and a back side; forming a plurality of grooves on the front side part way through the semiconductor substrate; filling the grooves with a polymer insulating material to form polymer filled grooves; optionally forming front side electrodes on the front side; thinning the semiconductor substrate from the back side to expose the polymer filled grooves; optionally forming backside electrodes on the back side; and then singulating the semiconductor substrate into a plurality of conductive substrates. Each conductive substrate includes at least one polymer filled groove extending edge to edge and orthogonally from the front side to the back side configured to separate the conductive substrate into a first semiconductor substrate and a second semiconductor substrate.

Prior to the singulating step, additional processes can be performed for fabricating a desired electronic device. For an optoelectronic device these processes can include LED chip mounting, wire bonding, depositing a phosphor layer and forming an encapsulating lens. An optoelectronic device fabricated using the method includes a conductive substrate having a first semiconductor substrate and a second semiconductor substrate separated by a polymer filled groove. The optoelectronic device also includes an encapsulated light emitting diode (LED) chip, a first electrode on the first semiconductor substrate, and a second electrode on the second semiconductor substrate.

Another optoelectronic device fabricated using the method includes a pair of parallel spaced polymer filled grooves, which electrically and thermally isolate three separate semiconductor substrates to provide separate heat transfer and electrical paths. Yet another optoelectronic device fabricated using the method includes a polymer filled groove which electrically and thermally isolates two separate semiconductor substrates one of which contains an integrated semiconductor device, such as a protective device (e.g., zener diode).

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1A:
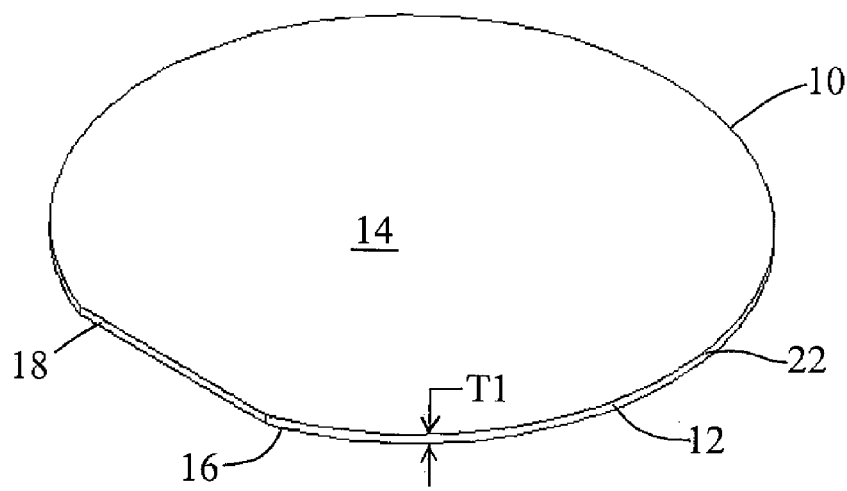
FIGS. 1A-1D are schematic perspective views illustrating steps in a method for fabricating conductive substrates for electronic and optoelectronic devices.

Referring to FIGS. 1A-1D and 2A-2C, steps in a method for fabricating a conductive substrate for an electronic device are illustrated. Although for illustrative purposes the steps of the method are shown in a particular order, the method can be practiced with a different order. Initially, as shown in FIG. 1A, a semiconductor wafer 10 can be provided. Although in the illustrative embodiment, the method is performed on an entire semiconductor wafer 10, it is to be understood that the method can be performed on a portion of a semiconductor wafer 10 or other suitable semiconductor substrate. Also in the illustrative embodiment, the semiconductor wafer 10 comprises a blank wafer. However, as will be further explained, the wafer 10 can include integrated circuits such as protective circuitry.

The semiconductor wafer 10 can comprise a conventional semiconductor wafer having a standard diameter and a full thickness (T1). By way of example, a 150 mm diameter wafer has a full thickness (T1) of about 675 μm, a 200 mm diameter wafer has a full thickness (T1) of about 725 μm, and a 300 mm diameter wafer has a full thickness (T1) of about 775 μm. In the illustrative embodiment, the semiconductor wafer 10 comprises silicon (Si). However, the semiconductor wafer 10 can comprise another material such GaAs, SiC, GaP, GaN or AlN. In addition, the semiconductor wafer 10 includes a semiconductor substrate 12 having a front side 14 (first side), and a back side 16 (second side), which are the major planar surfaces of the semiconductor wafer 10. The semiconductor wafer 10 also includes a major flat 18, which indicates the crystal orientation of the silicon.

Figure 1B:
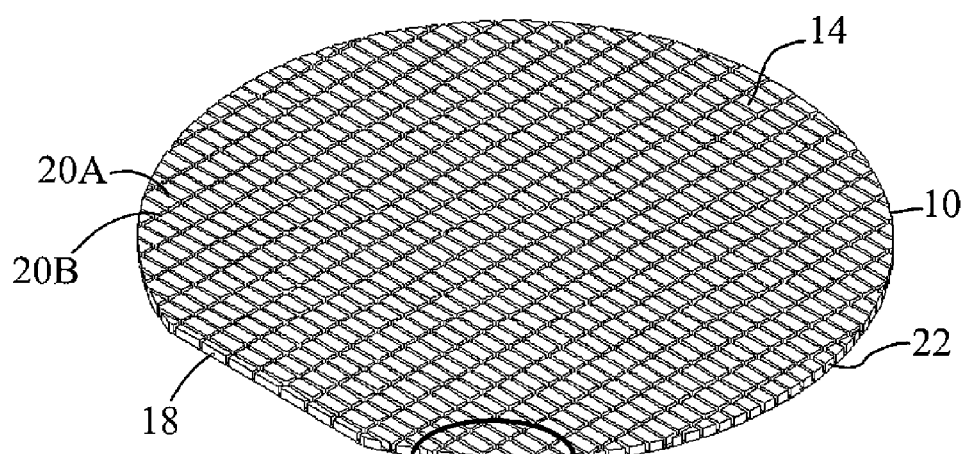
Figure 2A:
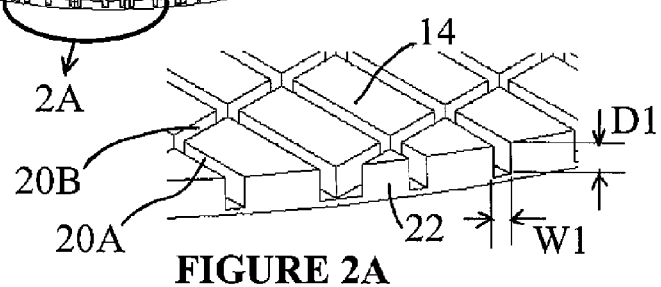
FIG. 2A is an enlarged schematic perspective view taken along line 2A of FIG. 1B.

Next, as shown in FIGS. 1B and 2A, a plurality of grooves 20A, 20B are formed on the front side 14 part way through the wafer 10 in a criss cross pattern. As shown in FIG. 2A, the grooves 20A, 20B extend to the edges 22 of the wafer 10 and have a depth D1 which is less than the thickness T1 (FIG. 1A) of the wafer 10. For example, D1 can equal from about 10% to 90% of T1. As also shown in FIG. 2A, the grooves 20A, 20B have a width W1 which can equal from about 1 μm to 2000 μm. The grooves 20A are generally parallel and spaced relative to one another, are generally perpendicular to the grooves 20B, and are generally parallel to the major flat 18. Similarly, the grooves 20B are generally parallel and spaced relative to one another, are generally perpendicular to the grooves 20A, and are generally perpendicular to the major flat 18. Although the grooves 20A, 20B are illustrated in a criss cross pattern, it is to be understood that the method can be performed with grooves in a parallel spaced pattern (e.g., just grooves 20A or just grooves 20B). Each groove 20A, 20B can be generally rectangular in cross section with two parallel sidewalls and an orthogonal bottom surface.

The grooves 20A, 20B (FIG. 1B) can be formed using a suitable process such as sawing or cutting the front side 14 of the wafer 10 using a dicing saw. The grooves 20A, 20B (FIG. 1B) can also be formed by etching the front side 14 of the wafer 10 using a wet etching process, a dry etching process, a breaking process or a plasma etching process. The grooves 20A, 20B (FIG. 1B) can also be formed by laser machining the front side 14 of the wafer 10 using a laser machining system. The grooves 20A, 20B (FIG. 1B) can also be formed by stamping the front side 14 of the wafer 10 using a press or similar apparatus. Because the grooves 20A, 20B (FIG. 1B) do not extend completely through the wafer 10, it can be handled using conventional equipment, such as a wafer handler, without breaking apart. Additionally, the wafer 10 can be supported during formation of the grooves 20A, 20B (FIG. 1B) using suitable equipment, such as a film frame or dicing tape (not shown).

Figure 1C:
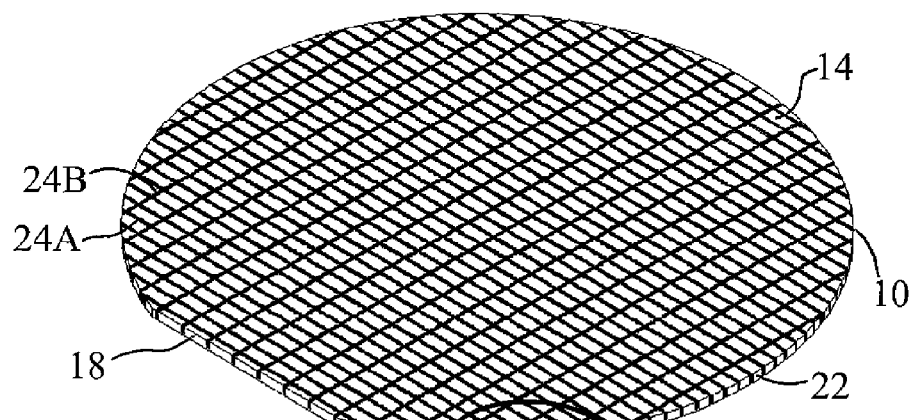
Figure 2B:
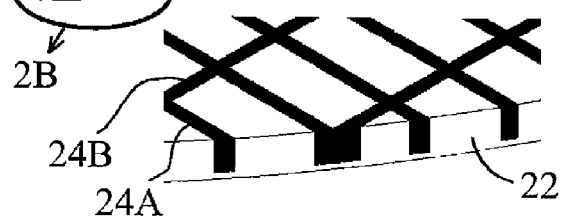
FIG. 2B is an enlarged schematic perspective view taken along line 2B of FIG. 1C.

Next, as shown in FIGS. 1C and 2B, the grooves 20A, 20B are at least partially filled with a polymer to form polymer filled grooves 24A, 24B. The polymer filled grooves 24A, 24B can be formed using a suitable process such as by deposition of the polymer through a nozzle into the grooves 20A, 20B, or by spatuling, screen printing or stenciling the polymer into the grooves 20A, 20B. The polymer filled grooves 24A, 24B can also be formed using any suitable process such as an injection molding process, a transfer molding process, a stenciling process, a screen printing process, a spin resist process, a dry film process, a stereographic lithographic process, or a CVD process. The polymer can comprise an electrically insulating, curable polymer such as a silicone, a polyimide, an epoxy, a ceramic paste, a glass paste or parylene. In addition, the polymer can include fillers, such as silicates, configured to reduce the coefficient of thermal expansion (CTE) and adjust the viscosity of the polymer material. Following deposition, the polymer can be cured or reacted to harden such as by placement in an oven at an elevated temperature for a suitable period of time. Following curing, the polymer filled grooves 24A, 24B can be planarized to the front surface 14 of the wafer 10 using a suitable process such as grinding or chemical mechanical planarization (CMP).

Figure 1D:
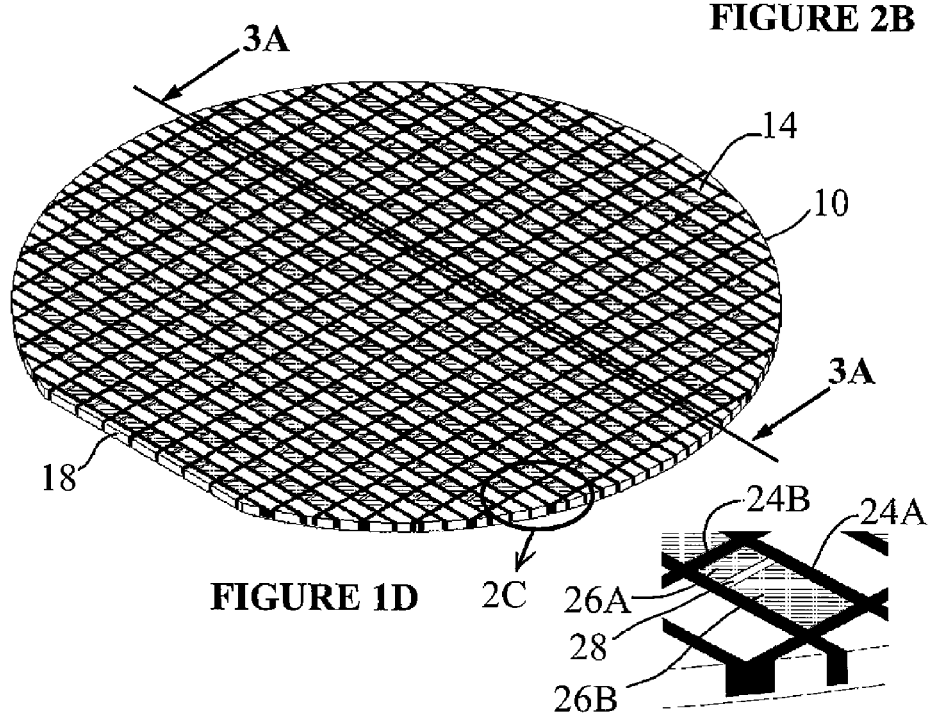
Figure 2C:
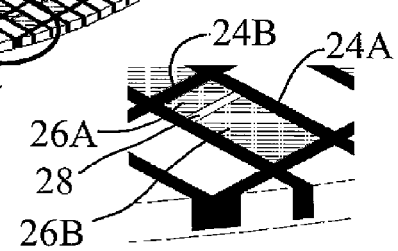
FIG. 2C is an enlarged schematic perspective view taken along line 2C of FIG. 1D.

Next, as shown in FIGS. 1D and 2C, a front side metal forming step is performed to form a plurality of front side electrodes 26A, 26B (FIG. 2C) separated by a plurality of spaces 28 (FIG. 2C). The front side electrodes 26A, 26B (FIG. 2C) can be formed using a suitable metallization process. As will be further explained, the spaces 28 (FIG. 2C) between the front side electrodes 26A, 26B form streets where the wafer 10 will be singulated as indicated by future singulation lines 30 (FIG. 3C).

The front side electrodes 26A, 26B can comprise a single layer of a highly conductive metal such as Ti, Ta, Cu, W, TiW, Hf, Ag, Au, or Ni deposited using sputtering, PVD, CVD, evaporation or electroless chemical deposition. However, rather than a single layer of material, the front side electrodes 26A, 26B can comprise a multi-metal stack, such as a bi-metal stack comprised of a conductive layer and a bonding layer (e.g., Ti/Ni/Au), or multi layers such a Ta/TaN/Cu/Ni/Au and alloys of these metals. The front side electrodes 26A, 26B can be formed using a suitable deposition process (i.e., additive process) such as PVD, electroless deposition, electroplating or PVD through a mask (not shown). As another example, the front side electrodes 26A, 26B can be formed by blanket deposition of a metal layer followed by etching through a mask (i.e., subtractive process).

Figure 3A:
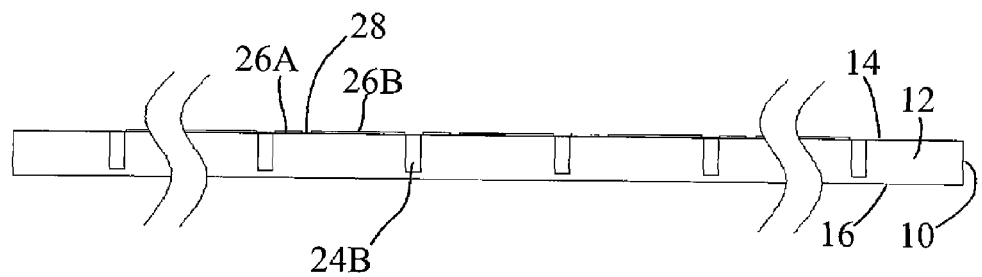
FIGS. 3A-3C are schematic cross sectional views illustrating further steps in the method of FIGS. 1A-1D with FIG. 3A taken along section line 3A-3A of FIG. 1D.
Figure 3B:
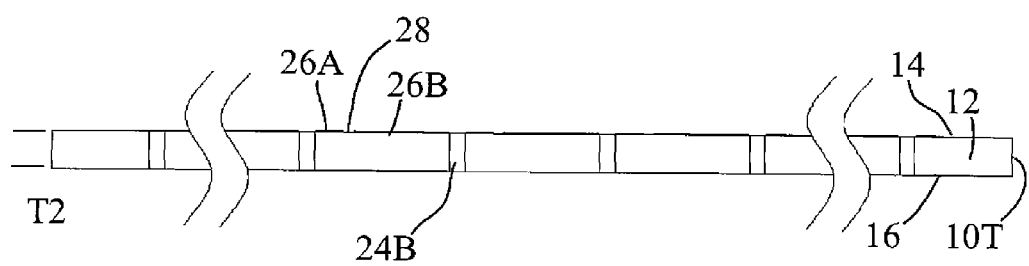
Figure 3C:
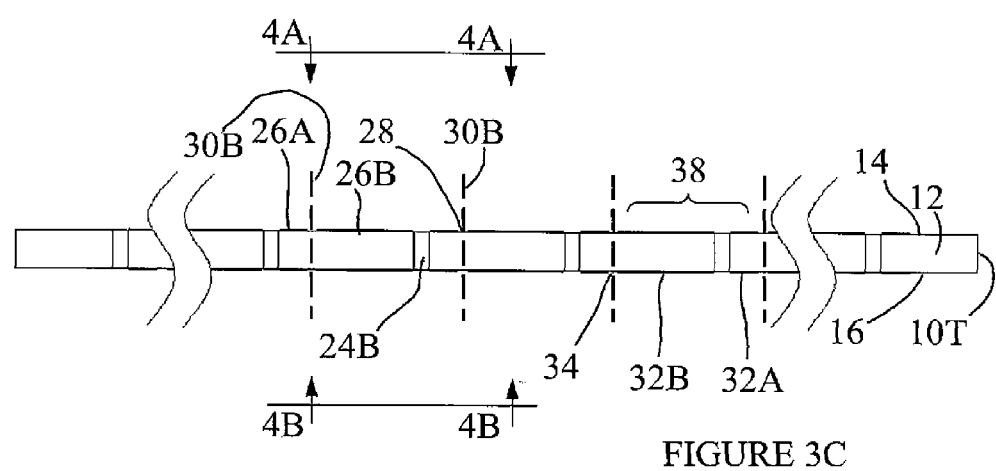

Referring to FIGS. 3A-3C, further steps in the method are illustrated. FIG. 3A is a cross section through FIG. 1D showing the polymer filled grooves 24B formed part way through the wafer. FIG. 3A also shows the front side electrodes 26A, 26B separated by the spaces 28 which correspond to the future singulation lines 30B (FIG. 3C).

Next, as shown in FIG. 3B, following formation of the front side electrodes 26A, 26B, a thinning and polishing step can be performed from the back side 16 of the wafer 10. The thinning and polishing step thins the wafer 10, polishes the back side 16, and exposes the polymer filled grooves 24A, 24B on the back side 16. The thinning and polishing step can be performed using a mechanical planarization process performed with a mechanical planarization apparatus, such as a grinder. This type of mechanical planarization process is sometimes referred to as dry polishing. One suitable mechanical planarization apparatus is manufactured by Okamoto, and is designated a model no. VG502. The thinning step can also be performed using a chemical mechanical planarization (CMP) apparatus. Suitable chemical mechanical planarization (CMP) apparatus are commercially available from manufacturers such as Westech, SEZ, Plasma Polishing Systems, and TRUSI. The thinning and polishing step can also be performed using an etch back process, such as a wet etch process, a dry etch process or a plasma etching process either performed alone or in combination with mechanical planarization. The thinning and polishing step can also be performed using a multi step process such as back grinding, followed by a soft polish step, then CMP and a cleaning step. The thickness T2 of the thinned wafer 10T can be selected as desired, with from 35 µm to 600 µm being representative. The thinned back side 16 has a smooth, polished surface, and is devoid of features.

Next, as shown in FIG. 3C, a back side metal forming step is performed to form a plurality of back side electrodes 32A, 32B separated by a plurality of spaces 34. The back side metal forming step can be performed as previously described for the front side metal forming step. In addition, the spaces 34 align with the spaces 28 (FIG. 3A) on the front side which correspond to the future singulation lines 30B (FIG. 3C). As also shown in FIG. 3C, a plurality of conductive substrates 38 are formed on the thinned wafer 10T. During a subsequent singulation step, the conductive substrates 38 will be separated along singulation lines 30A (FIG. 4A) and 30B (FIG. 3C).

Figure 4A:
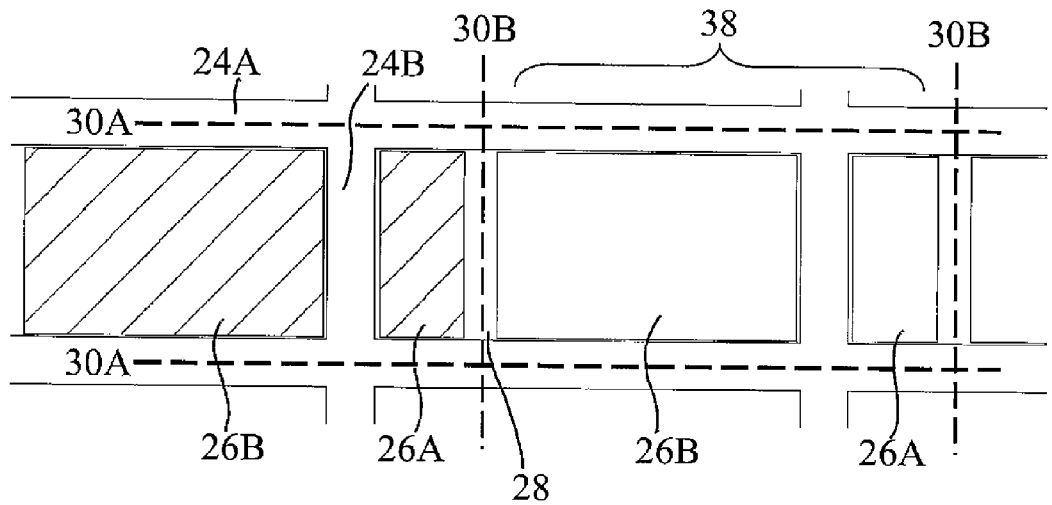
FIG. 4A is a plan view of a conductive substrate formed by the method of FIGS. 1A-1D taken along line 4A-4A of FIG. 3C.
Figure 4B:
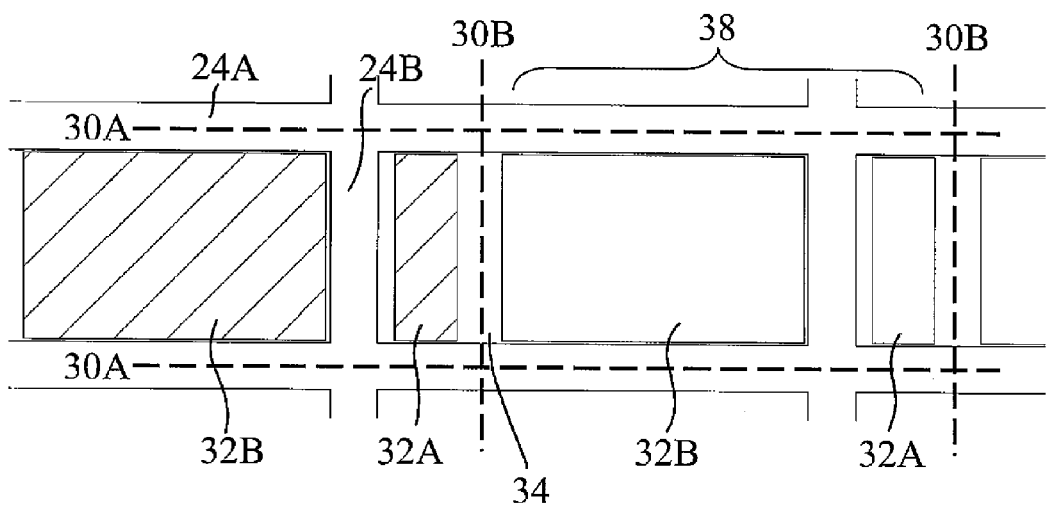
FIG. 4B is a bottom view of the conductive substrate formed by the method of FIGS. 1A-1D taken along line 4B-4B of FIG. 3C.

FIG. 4A is a plan view showing each conductive substrate 38 with a pair of front side electrodes 26A and 26B, a polymer filled groove 24B, and an outline defined by singulation lines 30A and 30B. FIG. 4B is a bottom view showing each conductive substrate 38 with a pair of back side electrodes 32A and 32B, a polymer filled groove 24B, and an outline defined by singulation lines 30A and 30B. As will be further explained, polymer filled grooves 24A will be trimmed away from the conductive substrate 38 along singulation lines 30A during the subsequent singulation step.

Figure 5A:
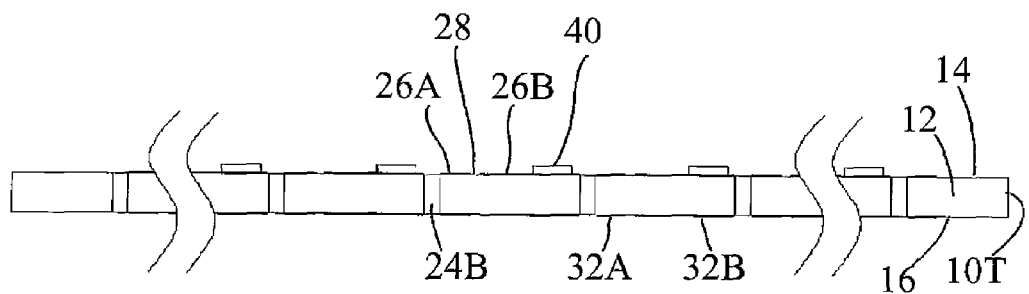
FIGS. 5A-5E are schematic cross sectional views illustrating steps in a method for fabricating an optoelectronic device with a conductive substrate.

Referring to FIGS. 5A-5E, further steps in the method are illustrated. The steps shown in FIGS. 5A-5E are for forming optoelectronic devices 36 (FIG. 6C) with the conductive substrates 38 (FIG. 6C). As is apparent, for forming other electronic devices different steps would be utilized. As shown in FIG. 5A, a light emitting diode mounting step can be performed to mount LED chips 40 on the front side 14 in electrical contact with the front side electrodes 26B. A bonding layer (not shown) can be formed using a solder reflow process, a bumping process or a silver epoxy curing process to bond the LED chips 40 to the front side electrodes 26B with each conductive substrate 38 having one LED chip 40. The LED chips 40 can comprise conventional LED chips fabricated using known processes. Suitable LED chips are commercially available from SEMILEDS, INC. located in Boise Id., and Miao-Li County, Taiwan, R.O.C.

Figure 5B:
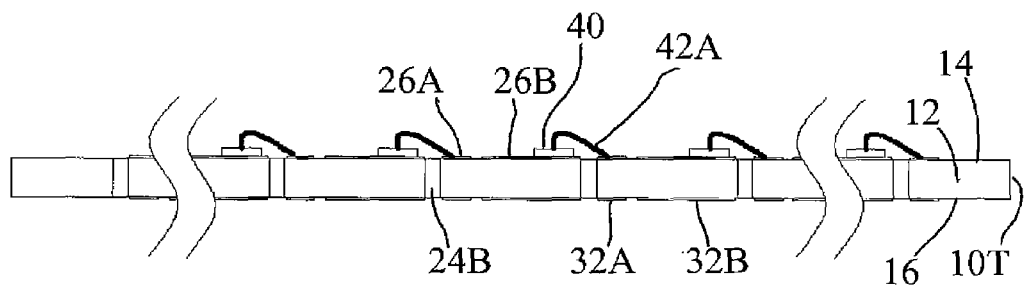

Next, as shown in FIG. 5B, a wire bonding step is performed in which wires 42A, 42B (FIG. 6A) are wire bonded to contacts on the LED chips 40. In addition, the wires 42A, 42B (FIG. 6A) cross over the polymer filled grooves 24B, and are wire bonded to the front side electrodes 26A. The wire bonding step can be performed using conventional wire bonding equipment.

Figure 5C:
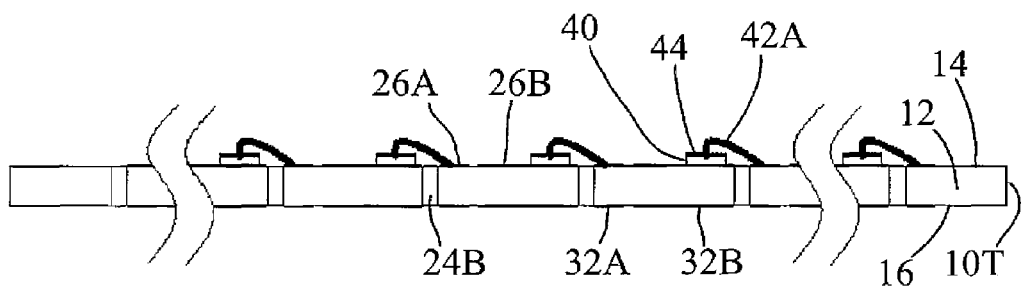

Next, as shown in FIG. 5C, a fluorescent layer deposition step is performed in which fluorescent material containing layers 44 are formed on the LED chips 40. As shown in FIG. 6C, the fluorescent material containing layers 44 can be formed to encapsulate the LED chips 40. The fluorescent material containing layers 44 can comprise a suitable material, such as a phosphor based material, which can be deposited using a suitable process such as spin on, dispensing or spray on and then patterned to cover the LED chips 40.

Figure 5D:
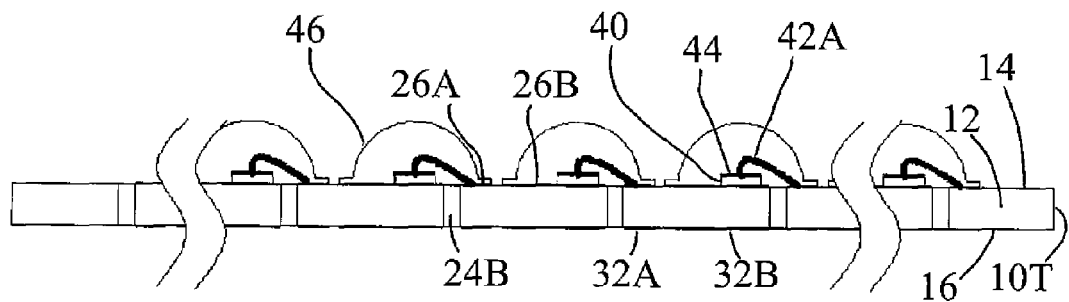

Next, as shown in FIG. 5D, a lens forming step is performed to form transparent domes 46 on the LED chips 40. The transparent domes 46 can comprise a transparent material, such as silicone, which function as encapsulating lenses for the optoelectronic devices 36 (FIG. 6C). The transparent domes 46 can be formed using a suitable process such as a molding process.

Figure 5E:
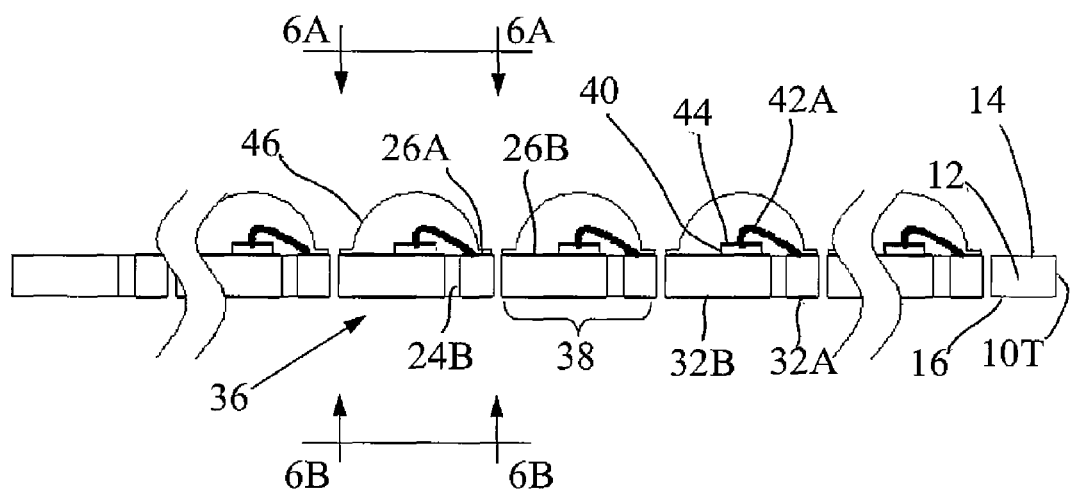

Next, as shown in FIG. 5E, a singulation step is performed to singulate the thinned semiconductor wafer 10T into a plurality of optoelectronic devices 36, each of which includes a conductive substrate 38. The singulation process is also referred to in the art as dicing. The singulation step can be performed using a process such as lasering, sawing, water jetting or etching, in which the individual optoelectronic devices 36 are separated along the singulation lines 30A and 30B (FIG. 4A). The singulation step also trims away the polymer filled grooves 24A (FIG. 2C). However, as previously explained, the method can be practiced by forming only the polymer filled grooves 24B in a parallel spaced pattern, rather than polymer filled grooves 24A, 24B in a criss cross pattern.

Figure 6A:
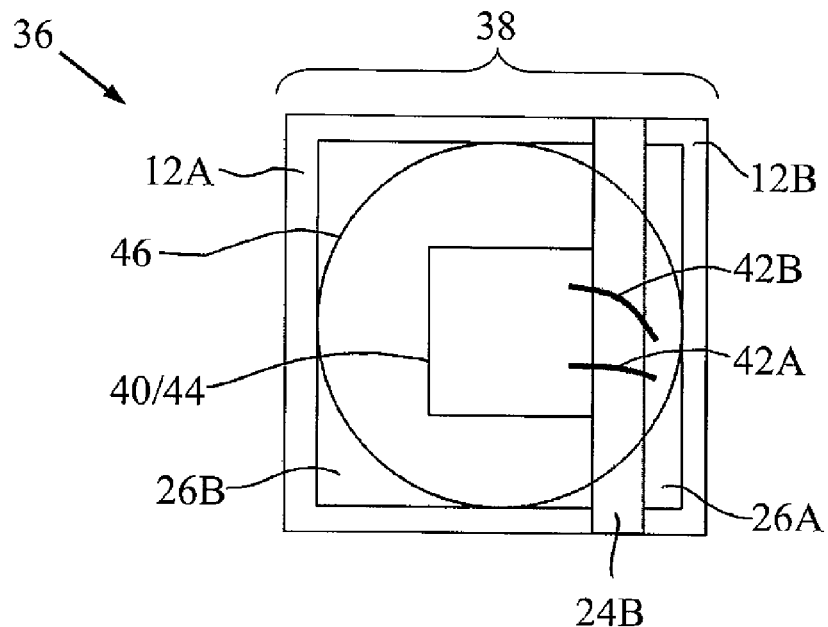
FIG. 6A is a plan view of the optoelectronic device taken along line 6A-6A of FIG. 5E.
Figure 6B:
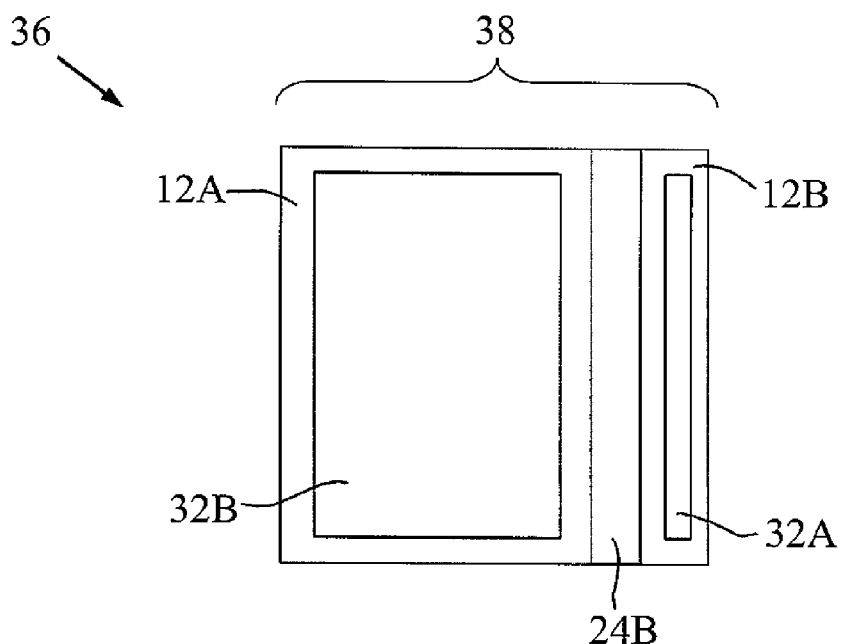
FIG. 6B is a bottom view of the optoelectronic device taken along line 6B-6B of FIG. 5E.
Figure 6C:
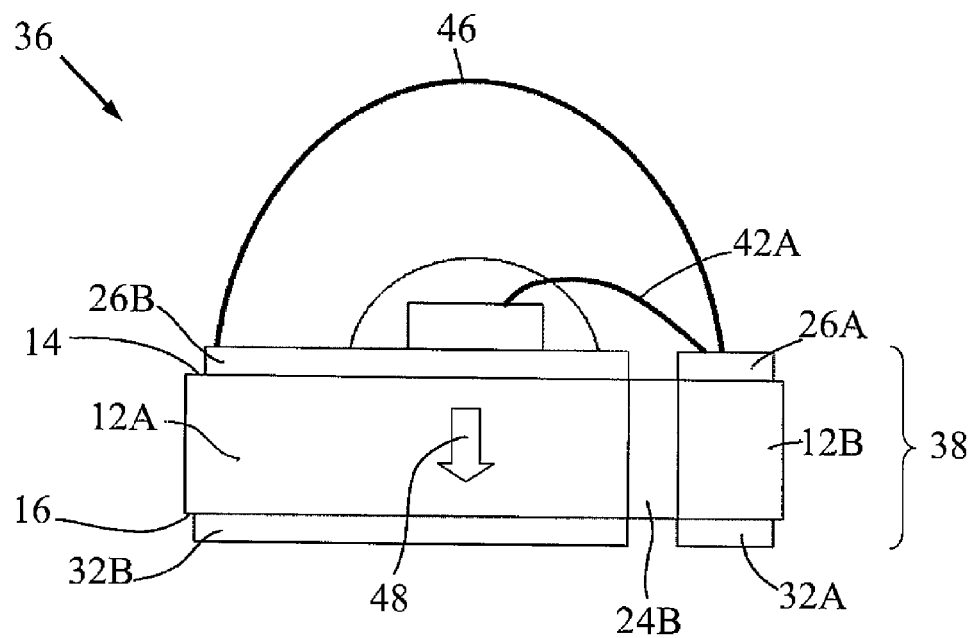
FIG. 6C is a cross sectional view of the optoelectronic device taken along line 6C-6C of FIG. 6A.

Referring to FIGS. 6A-6C, the optoelectronic device 36 is illustrated. The optoelectronic device 36 includes the conductive substrate 38 and the LED chip 40 mounted to the conductive substrate 38. As shown in FIGS. 6A and 6B, the polymer filled groove 24B extends completely across the conductive substrate 38 from edge to edge. As shown in FIG. 6C, the polymer filled groove 24B extends completely through the conductive substrate 38 from the front side 14 to the back side 16. In addition, the polymer filled groove 24B separates the conductive substrate 38 into a first semiconductor substrate 12A and a second semiconductor substrate 12B. The first semiconductor substrate 12A is in electrical contact with the front side electrode 26B, and in electrical contact with the back side electrode 32B. The first semiconductor substrate 12A thus provides an electrical path from the LED chip 40 to the back side electrode 32B. The second semiconductor substrate 12B is in electrical contact with the front side electrode 26A and in electrical contact with the back side electrode 32A. The second semiconductor substrate 12B thus provides an electrical path from the wires 42A, 42B to the back side electrode 32B. In addition, as shown in FIG. 6C, in the optoelectronic device 36, a heat transfer path 48 is provided from the LED chip 40 through the first semiconductor substrate 12A.

Figure 7A:
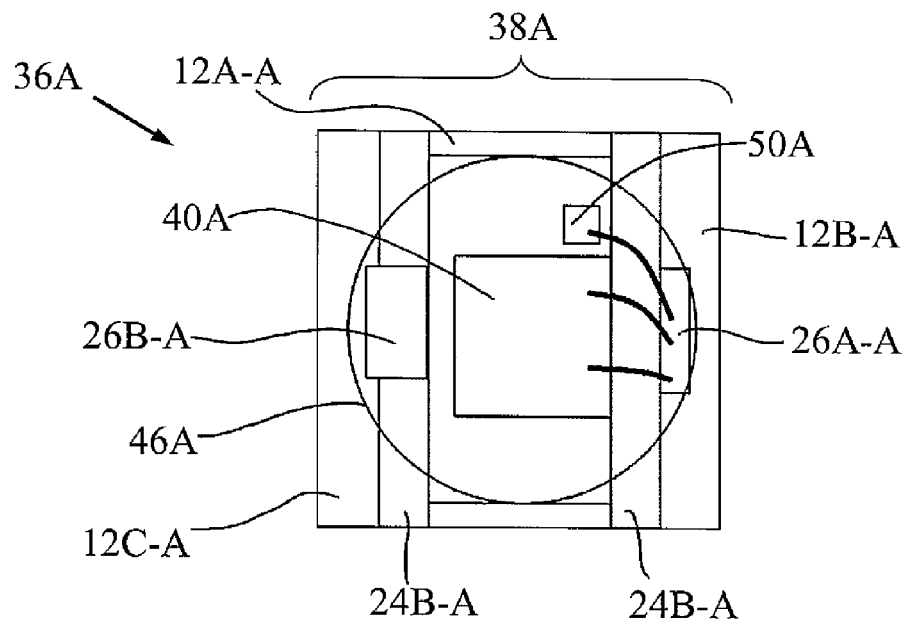
FIG. 7A is a plan view of an alternate embodiment optoelectronic device having a conductive substrate.
Figure 7B:
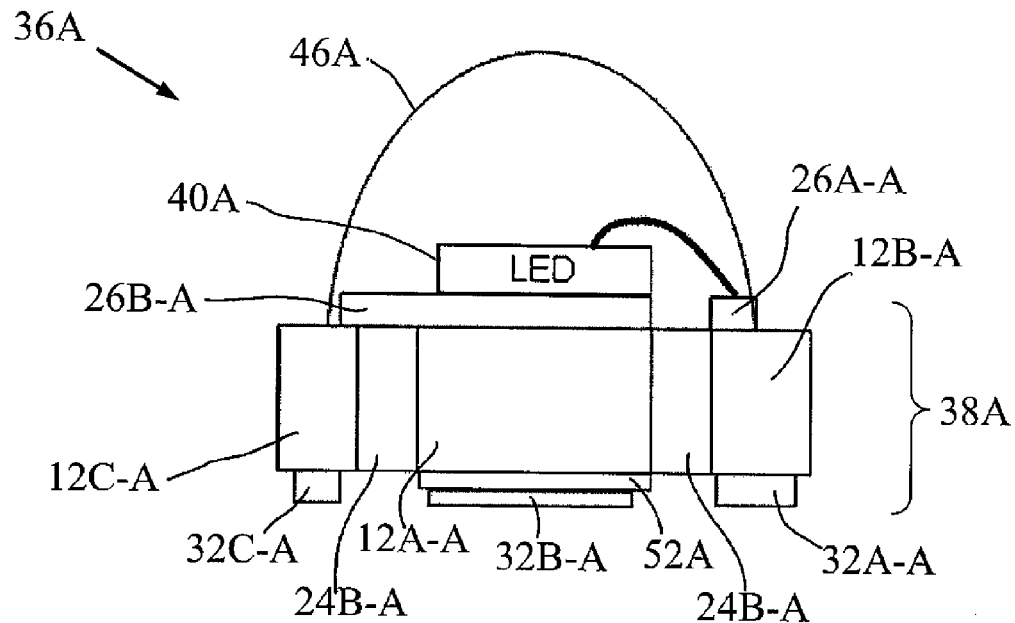
FIG. 7B is a side elevation view of the optoelectronic device of FIG. 7A.

Referring to FIGS. 7A-7B, a second optoelectronic device 36A is illustrated. Elements of the optoelectronic device 36A are denoted by the suffix A or −A on the same reference numerals previously used to describe optoelectronic device 36. The optoelectronic device 36A includes a conductive substrate 38A characterized by separate electrical and heat transfer paths, and a surface mounted protective device 50A, such as a zener diode. The optoelectronic device 36A also includes an LED chip 40A mounted to the conductive substrate 38A, a transparent dome 46A, and a fluorescent material containing layer as previously described, which for simplicity is not shown. The conductive substrate 38A is similar to the previously described conductive substrate 38 (FIG. 6C) but with three separate semiconductor substrates 12A-A, 12B-A and 12C-A. In addition, the optoelectronic device 36A includes a pair of parallel spaced polymer filled grooves 24B-A similar to the previously described polymer filled groove 24B (FIG. 6C), which separate and electrically insulate the semiconductor substrates 12A-A, 12B-A and 12C-A.

Further, the optoelectronic device 36A (FIGS. 7A-7B) includes a pair of front side electrodes 26A-A and 26B-A similar to the previously described front side electrodes 26A, 26B (FIG. 6C). However, the front side electrode 26B-A is in electrical contact with the first semiconductor substrate 12A-A, and also with the third semiconductor substrate 12C-A as well. Still further, the optoelectronic device 36A includes three back side electrodes 32A-A, 32B-A and 32C-A similar to the previously described back side electrodes 32A, 32B (FIG. 6C). However, the second back side electrode 32B-A is electrically insulated by a back side insulating layer 52A on the first semiconductor substrate 12A-A. The insulating layer 52A can comprise an electrically insulating, curable polymer such as a silicone, a polyimide, an epoxy, a ceramic paste, a glass paste, a silicon dioxide, a silicon nitride, AlN, $Al_2O_3$ or parylene. The first semiconductor substrate 12A-A and the second back side electrode 32B-A provide a separate heat transfer path from the LED chip 40A. In addition, the LED chip 40A is in electrical contact with the front side electrode 26B-A, which provides an electrical path through the third semiconductor substrate 12C-A to the third back side electrode 32C-A. Further, the LED chip 40A and the protective device 50A are wire bonded to the first front side electrode 26A-A which provides an electrical path through the second semiconductor substrate 12B-A to the first back side electrode 32A-A.

The optoelectronic device 36A (FIGS. 7A-7B) can be fabricated using the previously described method of fabrication for optoelectronic device 36 (FIG. 6C). However, the method is performed such that a pair of parallel, spaced, polymer filled grooves 24B-A per conductive substrate 38A are formed, rather than a single polymer filled groove 24B (FIG. 6C) as in conductive substrate 38 (FIG. 6C). In addition, the method is performed such that front side electrode 26B-A is in electrical contact with first semiconductor substrate 12A-A, and with the third semiconductor substrate 12C-A as well. Further, the method is performed such that three back side electrodes 32A-A, 32B-A and 32C-A are formed, and a back side insulating layer 52A is formed between the first semiconductor substrate 12A-A and the second back side electrode 32B-A. The optoelectronic device 36A can also be fabricated with a front side insulating layer (not shown) rather than a back side insulating layer 52A. The first semiconductor substrate 12A-A and the second back side electrode 32B-A thus function only to provide a heat transfer path from the LED chip 40A.

Figure 8A:
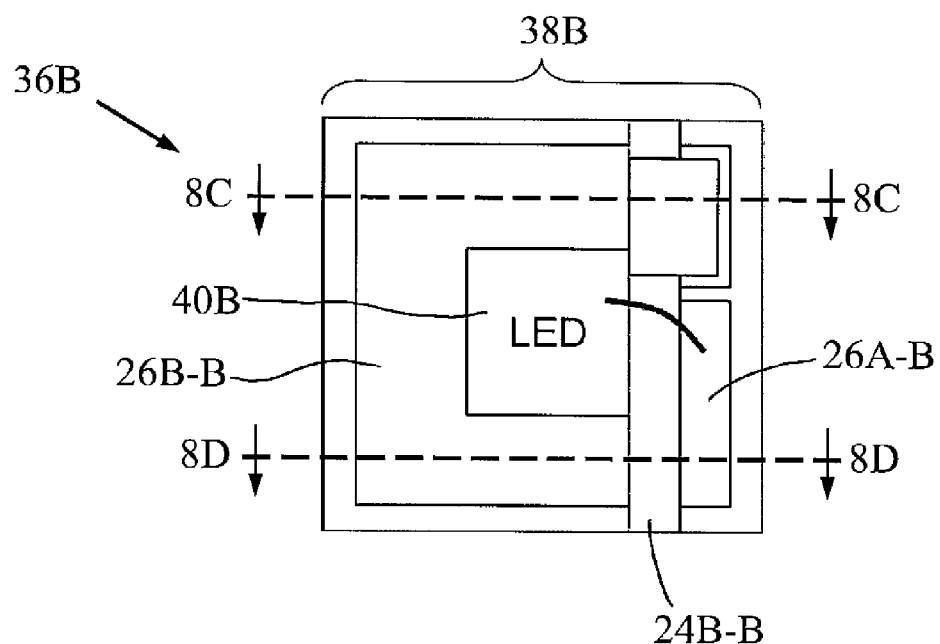
FIG. 8A is a plan view of an alternate embodiment optoelectronic device having a conductive substrate with a protective device.
Figure 8B:
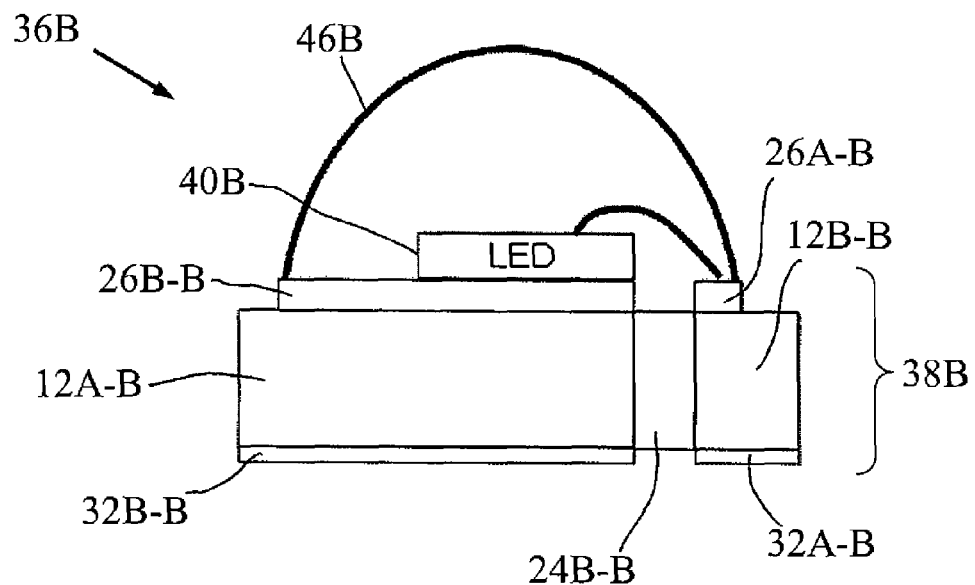
FIG. 8B is a side elevation view of the optoelectronic device of FIG. 8A.
Figure 8C:
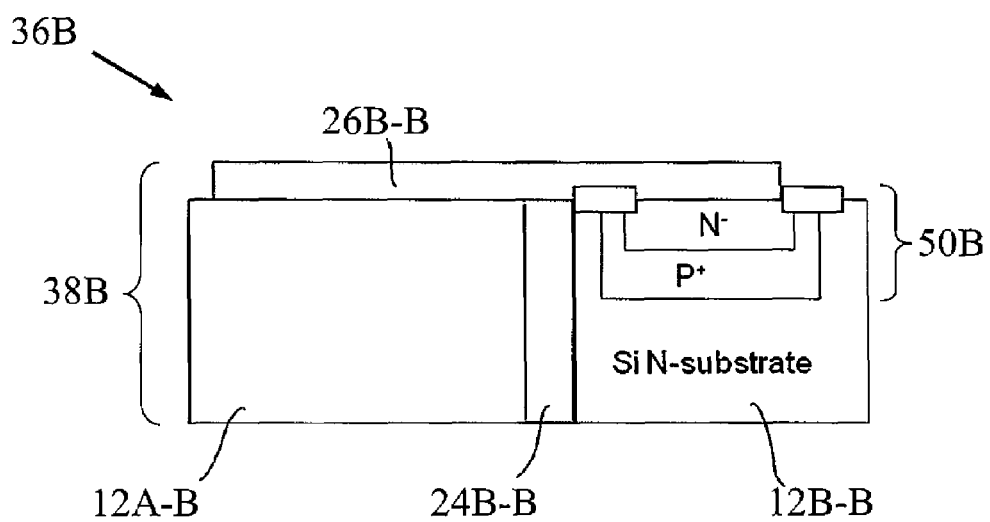
FIG. 8C is a cross sectional view taken along section line 8C-8C of FIG. 8A.
Figure 8D:
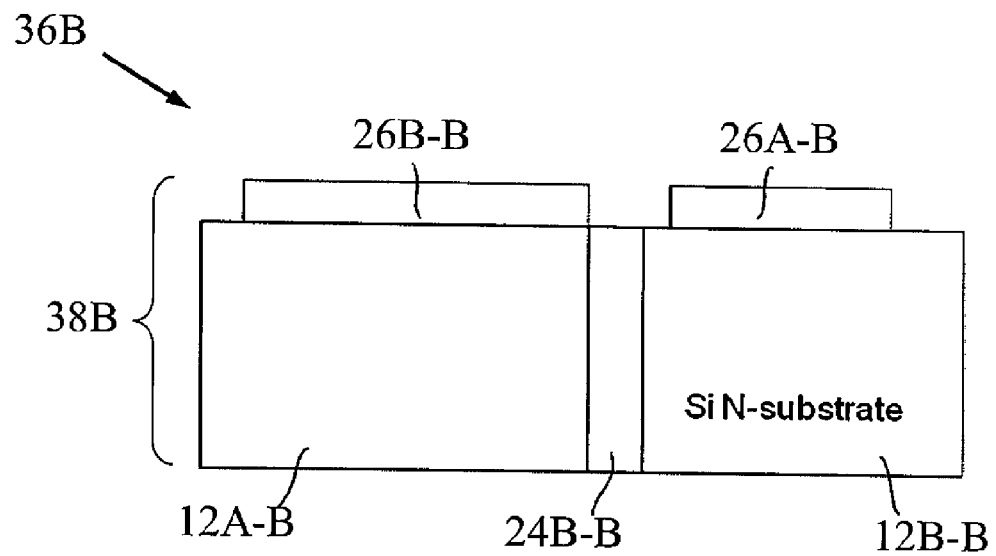
FIG. 8D is a cross sectional view taken along section line 8D-8D of FIG. 8A.
Figure 8E:
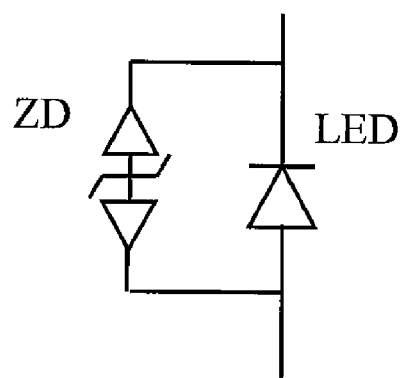
FIG. 8E is an electrical schematic of the optoelectronic device of FIG. 8A.

Referring to FIGS. 8A-8E, a third optoelectronic device 36B is illustrated. Elements of the optoelectronic device 36B are denoted by the suffix B or –B on the same reference numerals previously used to describe the optoelectronic device 36 (FIG. 6C). The optoelectronic device 36B includes a conductive substrate 38B characterized by an integrated protective device 50B, such as a zener diode. The optoelectronic device 36B also includes an LED chip 40B mounted to the conductive substrate 38B, a transparent dome 46B, and a fluorescent material containing layer as previously described, which for simplicity is not shown. The conductive substrate 38B is similar to the previously described conductive substrate 38 (FIG. 6C) and includes a first semiconductor substrate 12A-B and a second semiconductor substrate 12B-B separated by a polymer filled groove 24B-B. However, in this embodiment the second semiconductor substrate 12B-B includes an integrated protective semiconductor device 50B formed by separate N– and P+ layers on a Si N– substrate. As shown in FIG. 8E, the integrated protective semiconductor device 50B can comprise a zener diode ZD for protecting the LED chip 40B. The optoelectronic device 36B can be fabricated using the previously described method of fabrication for optoelectronic device 36 (FIG. 6C). However, the integrated protective semiconductor device 50B can be formed prior to the grooves 20A, 20B (FIG. 2A) using semiconductor fabrication techniques such as ion implantation and doping.

Figure 9A:
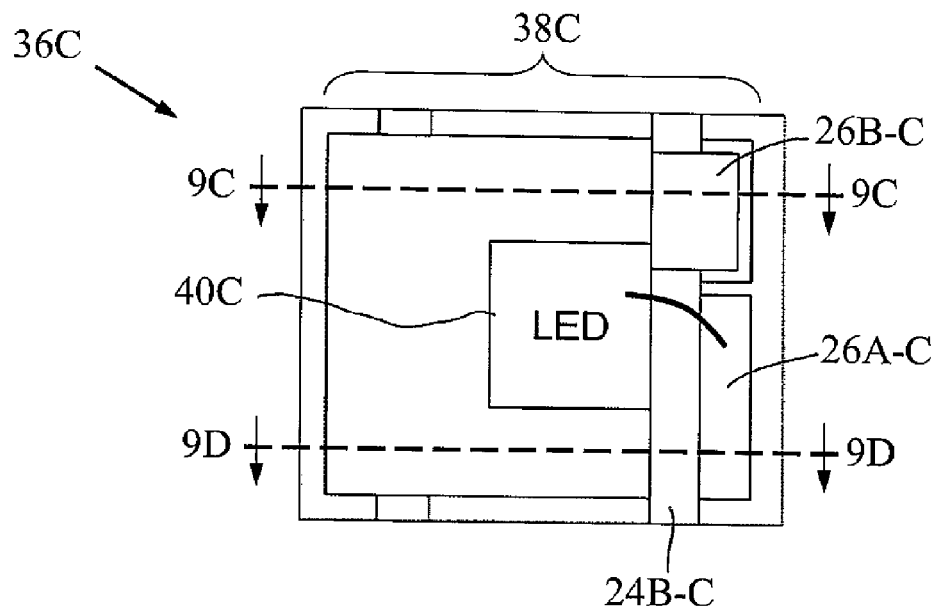
FIG. 9A is a plan view of an alternate embodiment optoelectronic device having a conductive substrate with a protective device.
Figure 9B:
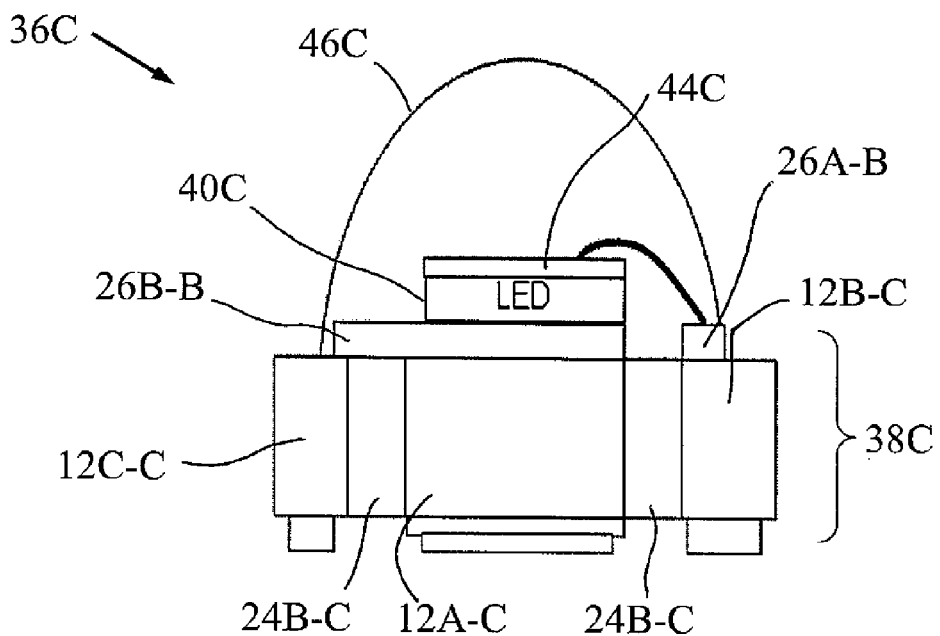
FIG. 9B is a side elevation view of the optoelectronic device of FIG. 9A.
Figure 9C:
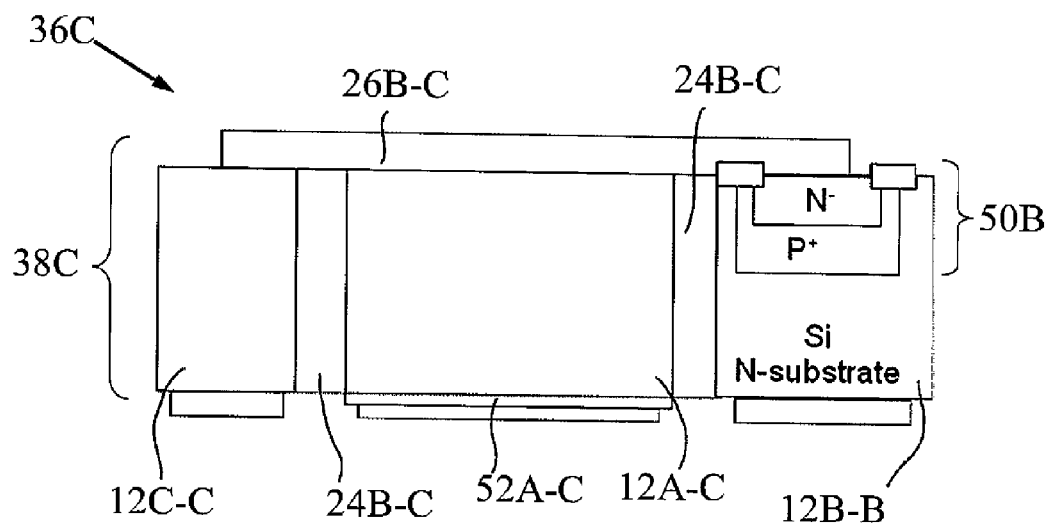
FIG. 9C is a cross sectional view taken along section line 9C-9C of FIG. 9A.
Figure 9D:
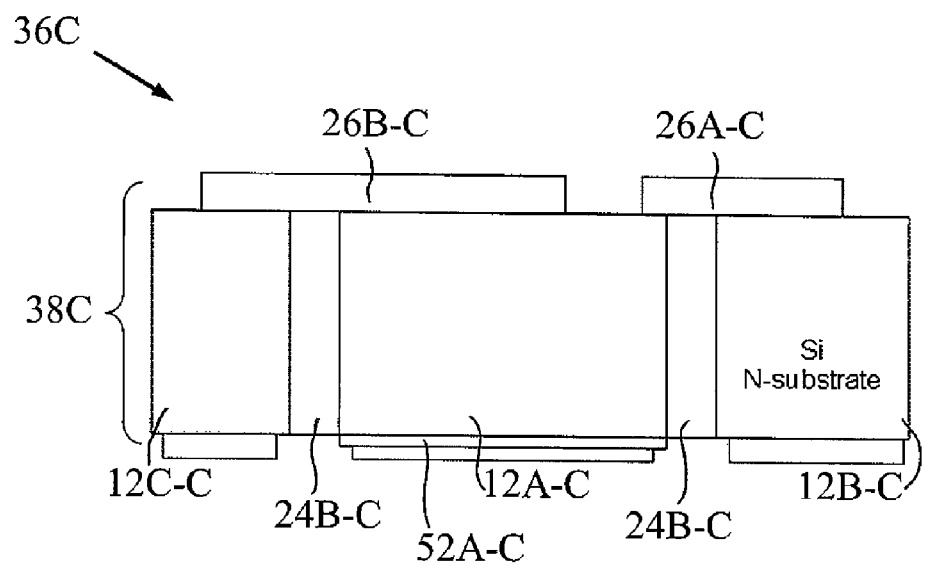
FIG. 9D is a cross sectional view taken along section line 9D-9D of FIG. 9A.
Figure 9E:
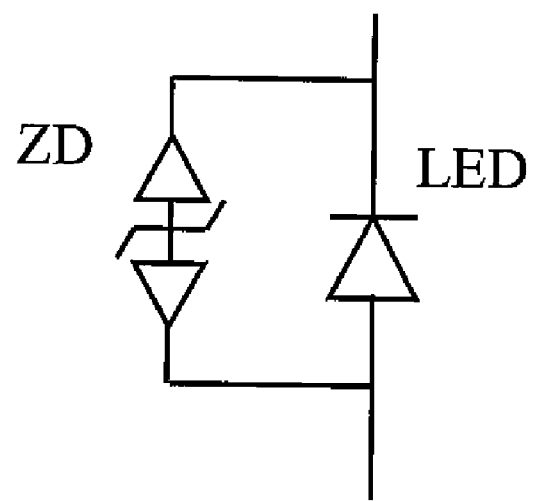
FIG. 9E is an electrical schematic of the optoelectronic device of FIG. 9A.

Referring to FIGS. 9A-9E, a fourth optoelectronic device 36C is illustrated. Elements of the optoelectronic device 36C are denoted by the suffix C or –C on the same reference numerals previously used to describe the optoelectronic device 36A (FIGS. 7A-7B). The optoelectronic device 36C includes a conductive substrate 38C characterized by separate electrical and heat transfer paths, and an integrated protective device 50C, such as a zener diode. The optoelectronic device 36C also includes an LED chip 40C mounted to the conductive substrate 38C, a transparent dome 46C, and a fluorescent material containing layer 44C. The conductive substrate 38C is similar to the previously described conductive substrate 38A (FIGS. 7A-7B) and includes a first semiconductor substrate 12A-C, a second semiconductor substrate 12B-C, and a third semiconductor substrate 12C-C separated by a pair of parallel, spaced polymer filled groove 24B-C. However, in this embodiment the second semiconductor substrate 12B-C includes an integrated protective semiconductor device 50C formed by separate N– and P+ layers on a Si N– substrate. As shown in FIG. 9E, the integrated protective semiconductor device 50C can comprise a zener diode ZD for protecting the LED chip 40C. The optoelectronic device 36C can be fabricated using the previously described method of fabrication for optoelectronic device 36 (FIG. 6C). However, the integrated protective semiconductor device 50C can be formed prior to the grooves 20A, 20B (FIG. 2A) using semiconductor fabrication techniques such as ion implantation and doping. In addition, a back side insulating layer 52A-C (FIG. 9C) can be formed to electrically insulate the first semiconductor substrate 12A-C which functions to provide only a heat transfer path. The optoelectronic device 36C can also be fabricated with a front side insulating layer (not shown) rather than a back side insulating layer 52A-C.

Figure 10:
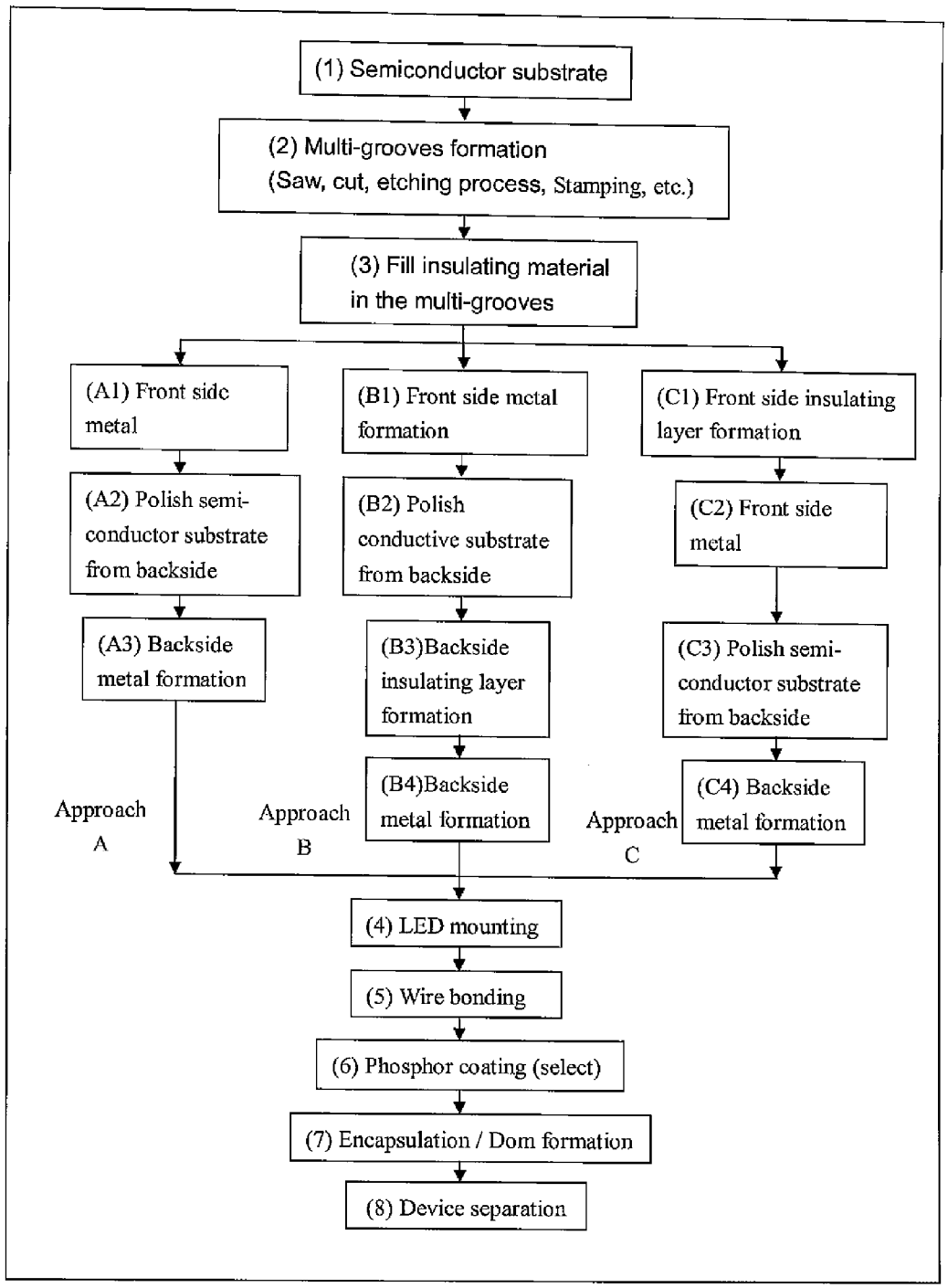
FIG. 10 is a process flow chart for fabricating the optoelectronic device of FIG. 6A or 7A.

Referring to FIG. 10, a process flow chart for fabricating the optoelectronic device 36 (FIGS. 6A-6C) or the optoelectronic device 36A (FIGS. 7A-7B) is illustrated. Approach A is for fabricating the optoelectronic device 36 (FIGS. 6A-6C). Approach B is for fabricating the optoelectronic device 36 (FIGS. 6A-6C). Approach C is for fabricating the optoelectronic device 36A (FIGS. 7A-7B) but with a front side insulating layer (not shown) rather than a back side insulating layer 52A (FIG. 7B).

Figure 11:
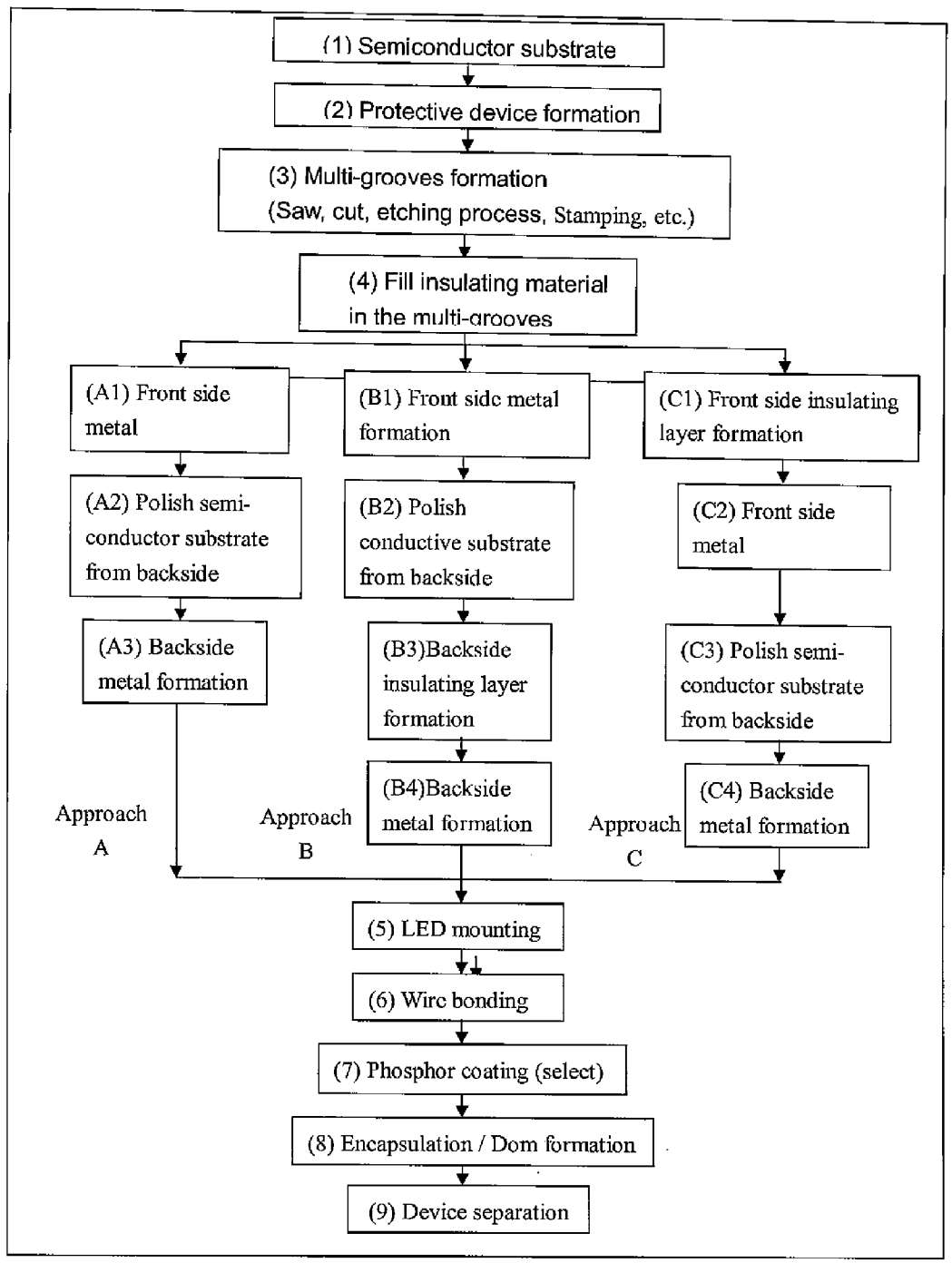
FIG. 11 is a process flow chart for fabricating the optoelectronic device of FIG. 8A or 9A.

Referring to FIG. 11, a process flow chart for fabricating the optoelectronic device 36B (FIGS. 8A-8E) or the optoelectronic device 36C (FIGS. 9A-9E) is illustrated. Approach A is for fabricating the optoelectronic device 36B (FIGS. 8A-8E).

Approach B is for fabricating the optoelectronic device 36C (FIGS. 9A-9E). Approach C is for fabricating the optoelectronic device 36C (FIGS. 9A-9C) but with a front side insulating layer (not shown) rather than a back side insulating layer 52A-C (FIG. 9C).

Thus the disclosure describes a method for making conductive substrate for electronic and optoelectronic devices such as light emitting diode (LEDs) as well as improved conductive substrates and optoelectronic devices. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating a conductive substrate for an electronic device comprising:
providing a semiconductor substrate having a front side and a back side;
forming a plurality of grooves on the front side part way through the semiconductor substrate;
filling the grooves with a polymer insulating material to form a plurality of polymer filled grooves;
thinning the substrate from the back side to expose the polymer filled grooves;
singulating the semiconductor substrate into a plurality of conductive substrates,
the forming the grooves step and the singulating step performed such that each conductive substrate comprises at least one polymer filled groove extending from edge to edge and from the first side to the second side configured to separate the conductive substrate into a first semiconductor substrate and a second semiconductor substrate.

2. The method of claim 1 wherein the forming the grooves step and the singulating step are performed to provide each conductive substrate with a pair of parallel spaced polymer filled grooves configured to provide the first semiconductor substrate, the second semiconductor substrate, and a third semiconductor substrate.

3. The method of claim 1 further comprising forming a plurality of front side electrodes on the front side of the semiconductor substrate, each conductive substrate including a first front side electrode on the first semiconductor substrate and a second front side electrode on the second semiconductor substrate separated by the at least one polymer filled groove.

4. The method of claim 1 further comprising forming a plurality of back side electrodes on the back side of the semiconductor substrate, each conductive substrate including a first back side electrode on the first semiconductor substrate and a second back side electrode on the second semiconductor substrate separated by the at least one polymer filled groove.

5. The method of claim 1 wherein the forming the grooves step forms the grooves in a parallel spaced pattern or in a criss cross pattern.

6. The method of claim 1 further comprising mounting a plurality of light emitting diode (LED) chips to the front side and wherein the forming the grooves step and the singulating step are performed to provide each conductive substrate with a light emitting diode chip electrically isolated by the at least one polymer filled groove.

7. The method of claim 1 further comprising forming a plurality of integrated semiconductor devices in the semiconductor substrate prior to the forming the grooves step, and wherein the forming the grooves step and the singulating step are performed to provide the second semiconductor substrate with an integrated semiconductor device.

8. A method for fabricating a conductive substrate for an electronic device comprising:
providing a semiconductor substrate having a front side and a back side;
forming a plurality of grooves on the front side part way through the semiconductor substrate;
filling the grooves with a polymer insulating material to form a plurality of polymer filled grooves;
forming a plurality of first electrodes and a plurality of second electrodes on the front side;
mounting a plurality of light emitting diode chips to the front side in electrical communication with the first electrodes and with the second electrodes;
thinning the substrate from the back side to expose the polymer filled grooves;
singulating the semiconductor substrate into a plurality of conductive substrates;
the forming the grooves step and the singulating step performed such that each conductive substrate comprises at least one polymer filled groove configured to separate the conductive substrate into a first semiconductor substrate having a light emitting diode (LED) chip on a first electrode, and a second semiconductor substrate having a second electrode in electrical communication with the first electrode.

9. The method of claim 8 wherein the semiconductor substrate comprises a semiconductor wafer.

10. The method of claim 8 wherein the mounting step comprises placing the light emitting diode (LED) chips in electrical contact with the first electrodes and wire bonding the light emitting diode (LED) chips to the second electrodes.

11. The method of claim 8 further comprising forming a plurality of integrated semiconductor devices in the semiconductor substrate and wherein the forming the grooves step and the singulating step are performed to provide the second semiconductor substrate with an integrated semiconductor device.

12. The method of claim 11 wherein the integrated semiconductor device comprises a zener diode.

13. The method of claim 8 wherein the polymer comprises a material selected from the group consisting of silicone, a polyimide, an epoxy, a ceramic paste, a glass paste and parylene.

14. A method for fabricating a conductive substrate for an electronic device comprising:
providing a semiconductor substrate having a front side and a back side;
forming a plurality of grooves on the front side part way through the semiconductor substrate;
filling the grooves with a polymer insulating material to form a plurality of polymer filled grooves;
forming a plurality of first front side electrodes and a plurality of second front side electrodes on the front side;
thinning the substrate from the back side to expose the polymer filled grooves;
mounting a plurality of light emitting diode (LED) chips on the front side in electrical contact with the first front side electrodes;
wire bonding the light emitting diode (LED) chips to the second front side electrodes;
singulating the semiconductor substrate into a plurality of conductive substrates;
the forming the grooves step and the singulating step performed such that each conductive substrate comprises at least one polymer filled groove configured to separate the conductive substrate into a first semiconductor substrate having a light emitting diode (LED) chip on a first front side electrode, and a second semiconductor substrate having a second front side electrode wire bonded to the first front side electrode.

15. The method of claim 14 further comprising forming a plurality of first back side electrodes and a plurality of second back side electrodes on the back side, and wherein the forming the grooves step and the singulating step are performed to provide the first semiconductor substrate with a first back side electrode and the second semiconductor substrate with a second back side electrode.

16. The method of claim 14 wherein the forming the grooves step and the singulating step are performed to provide each conductive substrate with a pair of parallel spaced polymer filled grooves configured to provide the first semiconductor substrate, the second semiconductor substrate, and a third semiconductor substrate.

17. The method of claim 14 wherein the forming the grooves step comprises a process selected from the group consisting of cutting, etching, breaking and laser machining.

18. The method of claim 14 further comprising forming a plurality of integrated semiconductor devices in the semiconductor substrate prior to the forming the grooves step, and wherein the forming the grooves step and the singulating step are performed to provide the second semiconductor substrate with an integrated semiconductor device.

19. The method of claim 14 wherein the forming the grooves step forms the grooves in a parallel spaced pattern or in a criss cross pattern.

20. The method of claim 14 further comprising forming a plurality of encapsulating domes on the light emitting diode chips prior to the singulating step.

\* \* \* \* \*